United States Patent
Kim et al.

(10) Patent No.: US 8,624,648 B2
(45) Date of Patent: Jan. 7, 2014

(54) SYSTEM RESET CIRCUIT AND METHOD

(75) Inventors: Tae Soo Kim, Suwon-si (KR); Min Ki Choi, Seoul (KR); Ju Young Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 166 days.

(21) Appl. No.: 13/150,469

(22) Filed: Jun. 1, 2011

(65) Prior Publication Data

US 2011/0298515 A1 Dec. 8, 2011

(30) Foreign Application Priority Data

Jun. 4, 2010 (KR) ........................ 10-2010-0052914

(51) Int. Cl.
*H03K 3/02* (2006.01)
(52) U.S. Cl.
USPC .......................................... 327/198; 327/142
(58) Field of Classification Search
USPC ................................................. 327/143, 198
See application file for complete search history.

(56) References Cited

U.S. PATENT DOCUMENTS

| 4,903,193 | A  | * | 2/1990  | Nakamura ........................ 714/55 |
| 5,570,674 | A  | * | 11/1996 | Izumiura et al. .............. 123/690 |
| 5,761,414 | A  | * | 6/1998  | Akaishi et al. .................. 714/55 |
| 6,417,704 | B1 | * | 7/2002  | Nakajima et al. ............. 327/143 |
| 6,456,135 | B1 | * | 9/2002  | Albean ......................... 327/198 |
| 7,996,732 | B2 | * | 8/2011  | Nishimura ...................... 714/55 |
| 2003/0141909 | A1 | * | 7/2003 | Iwaguro et al. ............... 327/142 |

FOREIGN PATENT DOCUMENTS

| KR | 10-1999-0032802 A | 5/1995 |
| KR | 10-0257597 B1     | 3/2000 |

\* cited by examiner

*Primary Examiner* — Ryan Jager
(74) *Attorney, Agent, or Firm* — Jefferson IP Law, LLP

(57) ABSTRACT

A system reset circuit and a method for resetting a system automatically according to an operation state of the system are provided. The system reset circuit includes a system, which is triggered by a first logic state during an operation of a program and a second logic state at termination of the program, for generating a trigger signal for maintaining the first logic state in a lockup state and a counter for receiving the trigger signal as an enable signal, for counting a period of the first logic state of the trigger signal, and for clearing the counting for a period of the second logic state, and of which an output node is connected to a reset node of the system, wherein, when the first logic state period of the trigger signal is maintained before the counter expires, the system generates a reset signal automatically.

12 Claims, 4 Drawing Sheets

SYSTEM RESET CIRCUIT AND METHOD

PRIORITY

This application claims the benefit under 35 U.S.C. §119(a) of a Korean patent application filed on Jun. 4, 2010 in the Korean Intellectual Property Office and assigned Serial No. 10-2010-0052914, the entire disclosure of which is hereby incorporated by reference

BACKGROUND OF THE INVENTION

1. Field of the Invention

The present invention relates to a system reset circuit and a method thereof. More particularly, the present invention relates to a system reset circuit and a method for resetting the system automatically according to the operation state of the system.

2. Description of the Related Art

Systems are usually controlled by means of processes for executing certain operations and functions. In a case where the system has entered a lockup state due to an abnormal operation of a program, it is routine for a user to reset the system manually by pushing a reset button or a power button provided outside of the system.

FIG. 1 is a circuit diagram illustrating a reset circuit according to the related art.

Referring to FIG. 1, a system is depicted under the assumption of a low reset state. If a reset switch 110 is in the off state, this denotes that the power source is not connected to ground, such that power is supplied to the reset node of the system 130 via the pull-up resister 120. Accordingly, the system 130 operates in a normal state. If the reset switch 110 is pushed by the user in the normal state, the power is bypassed to the ground node via the pull-up resister 120 and the reset switch 110. As a consequence, the ground potential is induced to the reset node, and thus the system 130 executes the operation for system initialization.

However, the system reset method of the related art has disadvantages in view of user convenience because, when a program enters the lockup state, the user has to reset the system with the external reset button. More particularly, when the system slows down for processing a large amount of data, the user is likely to misunderstand the system slow-down as the lockup state, resulting in resetting the system unnecessarily.

Therefore, a need exists for a system reset circuit and a method that is capable of detecting system lockup and resetting the system automatically when the system lockup is detected.

SUMMARY OF THE INVENTION

Aspects of the present invention are to address at least the above-mentioned problems and/or disadvantages and to provide at least the advantages described below. Accordingly, an aspect of the present invention is to provide a system reset circuit and a method that is capable of detecting system lockup and resetting the system automatically when the system lockup is detected.

In accordance with an aspect of the present invention, a system reset circuit is provided. The circuit includes a system, which is triggered by a first logic state during an operation of a program and a second logic state at termination of the program, for generating a trigger signal for maintaining the first logic state in a lockup state, and a counter for receiving the trigger signal as an enable signal, for counting a period of the first logic state of the trigger signal, and for clearing the counting for a period of the second logic state, and of which an output node is connected to a reset node of the system, wherein, when the first logic state period of the trigger signal is maintained before the counter expires, the system generates a reset signal automatically.

In accordance with another aspect of the present invention, a system reset method is provided. The method includes generating a trigger signal which has a first logic state during an operation of a program and a second logic state at termination of the program and maintaining the first logic state in a lockup state, generating a count signal for counting a period of the first logic state of the trigger signal and clearing the count for a period of the second logic state, and resetting a system in response to an automatic reset signal generated when the first logic state period of the trigger signal is maintained before a counter expires.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

Figure 1:
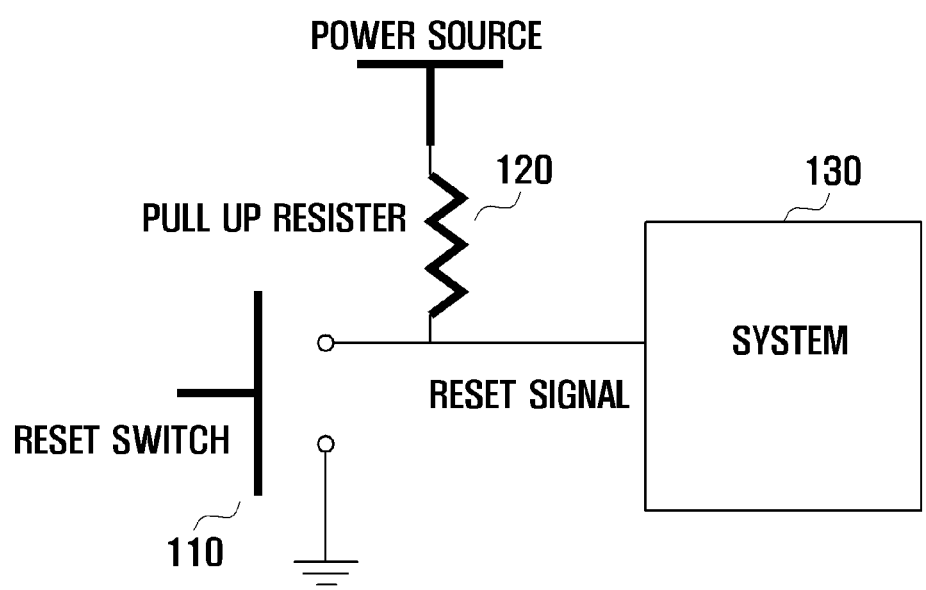
FIG. 1 is a circuit diagram illustrating a reset circuit according to the related art.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

According to exemplary embodiments of the present invention, if a lockup is detected, the system executes a system initialization function automatically. Since the system monitors to detect an abnormal operation and recovers from the abnormal state automatically, it is possible to reduce the number of unnecessary system resets by the user.

According to exemplary embodiments of the present invention, the system generates a trigger signal to indicate whether the system is operating normally, a counter generates a count signal according to the state of the trigger signal, and the system determines whether to reset the system according to the output of the counter as the system reset signal. The trigger signal is generated in the form of a pulse according to the execution of the program when the system operates normally or in the form of having a specific logic maintained when the system operates abnormally. The counter is set to a count value greater than a cycle of the trigger signal. That is, the count value of the counter is set to a value greater than the time duration taken for completing a program normally. Accordingly, when the trigger signal is generated abnormally, the counter outputs an automatic system reset signal.

Figure 2:
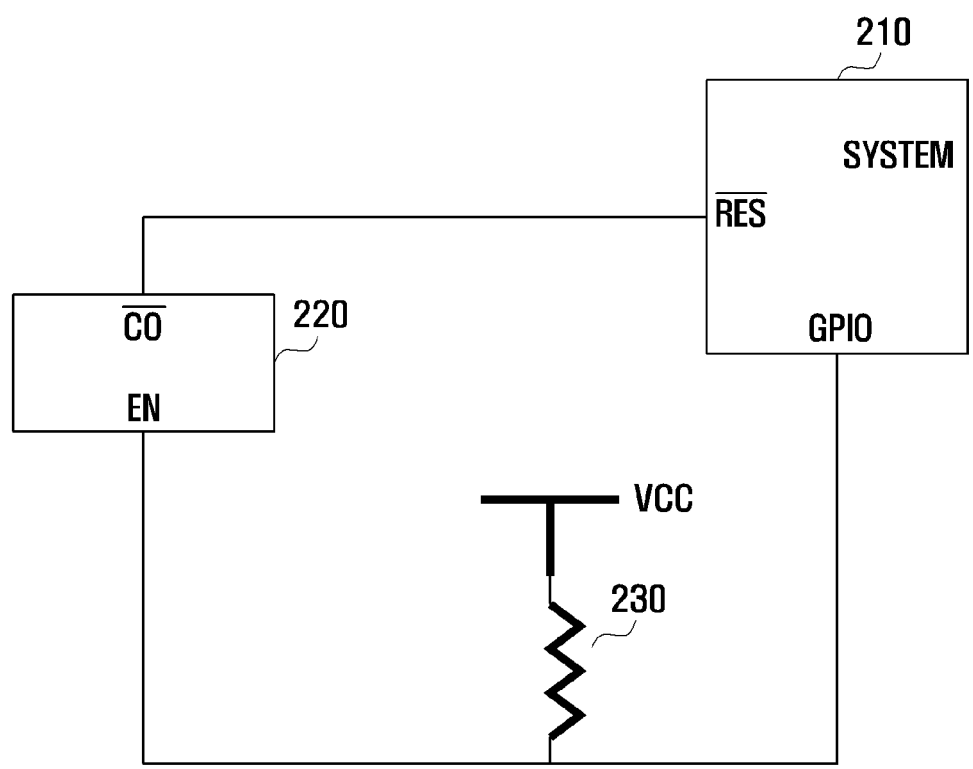
FIG. 2 is a circuit diagram illustrating a configuration of a system reset circuit according to an exemplary embodiment of the present invention.
Figure 3:
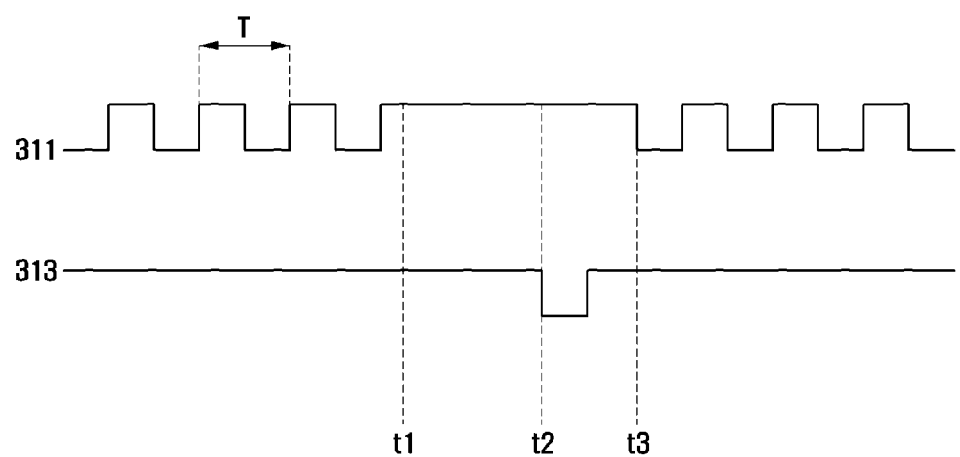
FIG. 3 is a graph illustrating waveforms of a trigger signal according to an exemplary embodiment of the present invention.
Figure 4:
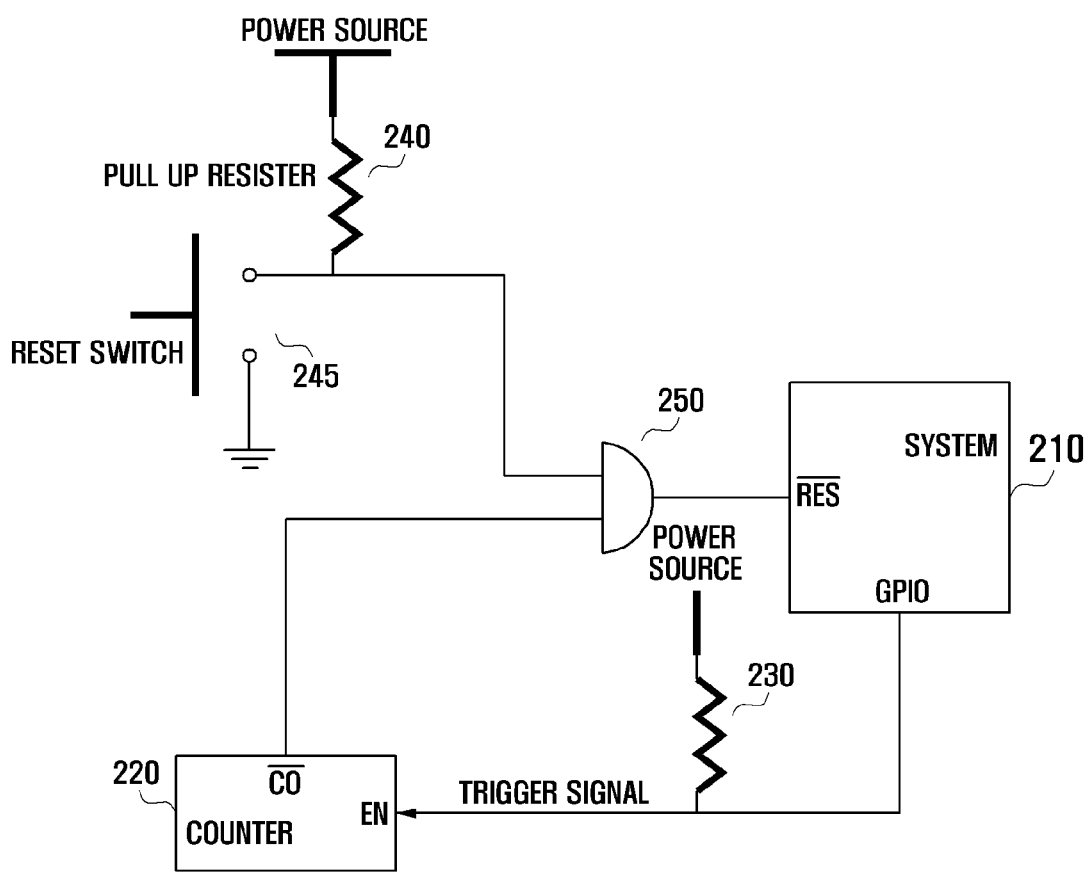
FIG. 4 is a circuit diagram illustrating a configuration of a system reset circuit having a reset switch according to an exemplary embodiment of the present invention.

FIGS. 2 through 4, discussed below, and the various exemplary embodiments used to describe the principles of the present disclosure in this patent document are by way of illustration only and should not be construed in any way that would limit the scope of the disclosure. Those skilled in the art will understand that the principles of the present disclosure may be implemented in any suitably arranged communications system. The terms used to describe various embodiments are exemplary. It should be understood that these are provided to merely aid the understanding of the description, and that their use and definitions in no way limit the scope of the invention. Terms first, second, and the like are used to differentiate between objects having the same terminology and are in no way intended to represent a chronological order, unless where explicitly state otherwise. A set is defined as a non-empty set including at least one element.

FIG. 2 is a circuit diagram illustrating a configuration of a system reset circuit according to an exemplary embodiment of the present invention. FIG. 3 is a graph illustrating waveforms of a trigger signal according to an exemplary embodiment of the present invention.

Referring to FIGS. 2 and 3, a system 210 generates a trigger signal to the Enable Node (EN) of the counter 220 via a General Purpose Input/Output (GPIO) node. The output of the counter 220 is applied to the reset node of the system. Here, the trigger signal can be a signal represented by a waveform having a period (T) in a normal operation state, as denoted by reference number 311, or a signal maintaining a predefined logic for the execution of a program. In the former case, when the system 210 operates normally, the trigger signal has a waveform of alternating low and high logic levels. Here, the trigger signal can be designed to have a low/high duty ratio of 1:1 or another duty ratio. In the latter case, the system generates a signal to maintain a predefined logic during the execution of a program and is triggered by the end of the program execution to transition to another logic. The system 210 generates a trigger signal having a predefined logic when an abnormal state, such as a system lockup, is detected.

The following description is made under the assumption that, when system 210 is locked up, the trigger signal is in a high logic state and the system reset is enabled in a low logic state. In addition, it is assumed that the counter 220 is enabled in a high logic state to start counting and disabled in a low logic state to initialize the count value. In addition, it is assumed that the counter 220 generates the low logic signal to the Counter Output (CO) node as the counting is completed. The count value of the counter 220 is set to a value greater than the period (T) of the trigger signal. That is, the trigger signal maintains the high logic period (t1-t2 period in FIG. 3) when the system is operating abnormally. Accordingly, the counter 220 is designed to have the count value greater than the period (T) of the pulse signal generated in the normal operation state.

The trigger signal can be generated in the waveform as denoted by reference number 311 of FIG. 3. That is, the system 210 maintains a predefined logic state (here, the high logic state) while running a program and generates a trigger signal in which the logic state transitions to another logic state (here, the low logic state) when the running program is terminated. In this case, the count value of the counter 220 has to be set to a value greater than the running time of the program having the greatest running time. The counter 220 is activated while the trigger pulse is maintained in the high logic state to perform counting.

The following description is made under the assumption that the system 210 generates the trigger signal having the waveform as denoted by reference number 311. In the normal operation state (before the time t1 in FIG. 3), the system generates the trigger signal having the period of T. In this case, since the count complete signal is not generated, the counter 220 outputs the signal having the waveform of high logic state as denoted by reference number 313 of FIG. 3. Accordingly, the high logic signal is applied to the reset node of the system 210 such that the system 210 maintains its normal operation without reset. That is, the counter 220 is in a clearing state for the low logic duration and performs counting for the high logic duration. At this time, since the count value is set to the value greater than the period (T), the output of the counter 220 maintains the high logic state.

In a case where the system operates abnormally, the system 210 generates the trigger signal in which a predefined logic state (here, a high logic state) is maintained. That is, if the abnormal state is detected at time point t1 (see FIG. 3), the system 210 generates the trigger signal having the waveform in which the high logic state is maintained. Once the trigger signal is generated, the counter 220 maintains the enable state so as to continue counting. If the high logic state is not changed (i.e., the abnormal state of the system is maintained) until the preset count value expires, the counter 220 generates a count expiry signal for the low logic at the time point t2 as shown in the waveform 313 of FIG. 3. The low logic count expiry signal is applied to the reset node of the system 210 such that the system performs automatic system initialization operation.

After the system initialization, the system generates the normal trigger signal at the time point t3 at which the system starts operating normally. After outputting the count expiry signal, the counter 220 starts counting again. The count value of the counter 220 is greater than the period T of the pulse signal generated in the normal operating state and designed to have the count value greater than the time duration for the system reset operation. This is to prevent the counter 220 from generating another reset signal during the system reset operation (i.e., the duration from the detection of the reset signal to the completion of the system initialization). That is, the count value is greater than a period of the normal trigger signal and the system reset duration so as to prevent another reset signal from being generated during the system initialization process.

If the reset signal of a low logic state is detected, the system 210 performs system reset and generates the normal trigger signal having a predefined period after the completion of the system reset. That is, after the system initialization (time point t3 in FIG. 3), the system 210 generates the normal trigger signal such that the counter 220 outputs the signal having the waveform 313 in which the high logic state is maintained as shown in FIG. 3. In this case, the counter 220 initializes the counting operation for the low logic duration and continues counting for the high logic duration in the trigger signal having the waveform 311 of FIG. 3 such that the counter 220 does not generate the count expiry signal having the waveform 313 of FIG. 3. Accordingly, the system 210 can operate normally.

As described above, in a case where the abnormal state of the systems continues over a predefined time (count expiry of the counter), the system reset signal is generated automatically such that the system is initialized. Accordingly, when the system lockup is detected while the system is running, it is possible to recover the system automatically. Since the trigger signal is generated normally when the system slows down but not in the lockup state, it is possible to avoid the unnecessary system reset caused by the user's misunderstanding.

The system reset method according to an exemplary embodiment of the present invention includes generating a trigger signal having a predefined period and the waveform maintaining a predefined logic state in a normal operating state and generating a count signal which counts for a predefined logic state and clears for the other logic state, and the count signal is output to the system as the reset signal when the predefined logic state of the trigger signal is maintained before the expiry of the count such that the system executes system reset automatically according to the reset signal.

FIG. 4 is a circuit diagram illustrating a configuration of a system reset circuit having a reset switch according to an exemplary embodiment of the present invention.

Referring to FIG. 4, a system 210 outputs a trigger signal indicating whether the system operates abnormally. The counter 220 receives the trigger signal as an enable signal and, when the abnormal state of the system continues over a predefined time, sets a count value for resetting the system automatically. As described above, the counter 220 is set to a value greater than the period of the trigger signal and also the time required for the system initialization. The output of the counter 220 is input to the gate 250 along with the output of the reset switch 245. The gate 250 performs a logical operation on the two inputs such that logical operation result is applied to the reset node of the system 210. Here, the gate 250 is implemented as an AND gate when the output signal of the counter 220 and the on signal of the reset switch 245 are low logic reset or an OR gate when the output signal of the counter 220 and the on signal of the reset switch 245 are high logic reset. In FIG. 4, the system reset circuit is depicted under the assumption of the AND gate. In FIGS. 2 and 4, the resisters 230 and 240 are the pull-up resisters connected to the power source.

In the abnormal state, the system 210 generates a trigger signal having a predefined logic (here, high logic) as shown in the waveform 313 of FIG. 3. If the trigger signal is input, the counter 220 counts the internal clock for the duration of the high logic and generates a count expiry signal at the time point when the predefined count value expires. If the count expiry signal is input, the AND gate 250 generates a low logic signal such that the system 210 performs the reset operation. If the reset switch 245 is manually turned on, the low logic signal is applied to the AND gate 250 such that the system 210 performs the reset operation. The system reset is triggered automatically by the counter 220 when the abnormal state of the system continues over the predefined time or manually by the user pushing the reset switch 245.

The trigger pulse generated in the system can have various waveforms. For example, the trigger signal can be generated in the waveform having a period for the normal operation of the system 210 and the waveform maintaining the high logic state for the system lockup. In this case, the system 210 generates the trigger pulse of the high logic signal while the system is running a program, and the counter 220 performs counting while the trigger signal maintains a high logic state. The system 210 generates the trigger signals having different periods according to the operation time of the program. Accordingly, the counter should be set to a count value greater than a value representing the program having the longest execution time. The counter 220 is activated during the high logic state of the trigger pulse to continue counting.

The system 210 is triggered by the low logic signal when the program is terminated normally, and at this time the high logic period of the trigger signal occurs to be shorter than the count value of the counter 220. In a case where the program is terminated normally, the counter 220 clears the counter value and stops counting. In a case where the program is terminated abnormally, the system maintains the trigger signal in a high logic state, and at this time the high logic period of the trigger signal occurs to be longer than the count value of the counter 220. The counter 220 continues counting to the maximum value of the counter 220 and generates the count expiry signal in a low logic state. If the count expiry signal is generated by the counter 220, the system 210 executes the reset operation.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A system reset circuit, comprising:
   a system, which is triggered by a first logic state during an operation of a program and a second logic state at termination of the program, for generating a trigger signal for maintaining the first logic state in a lockup state;
   a reset switch for connecting a power source node and a ground node;
   a counter for receiving the trigger signal as an enable signal, for counting a period of the first logic state of the trigger signal, and for clearing the counting for a period of the second logic state, and of which an output node is connected to a reset node of the system; and
   a gate for receiving outputs of the reset switch and the counter and having an output node connected to the reset node of the system,
   wherein, when the first logic state period of the trigger signal is maintained before the counter expires, the counter generates a reset signal automatically.

2. The circuit of claim 1, wherein the counter is set to a value greater than a program execution time configured normally.

3. The circuit of claim 2, wherein the gate comprises an AND gate, the first logic state is a high logic, and the second logic state is a low logic.

4. The circuit of claim 3, wherein the outputs of the reset switch and the counter are low logic resets.

5. The circuit of claim 2, wherein the gate comprises an OR gate, the first logic state is a high logic, and the second logic state is a low logic.

6. The circuit of claim 5, wherein the outputs of the reset switch and the counter are high logic resets.

7. A system reset method, comprising:
generating, by a system, a trigger signal which has a first logic state during an operation of a program and a second logic state at termination of the program and maintaining the first logic state in a lockup state;
generating, by a counter, a count signal for counting a period of the first logic state of the trigger signal and clearing the count for a period of the second logic state;
generating a reset signal by performing a logical operation on outputs of a reset switch and a count signal; and
resetting the system in response to an automatic reset signal generated by the counter when the first logic state period of the trigger signal is maintained until the counter expires or in response to a manual reset signal generated by the reset switch.

8. The method of claim 7, wherein the counter is set to a value greater than a program execution time configured normally.

9. The method of claim 8, wherein the logical operation comprises an AND operation, the first logic state is a high logic, and the second logic state is a low logic.

10. The method of claim 9, wherein the outputs of the reset switch and the counter are low logic resets.

11. The method of claim 8, wherein the gate comprises an OR gate, the first logic state is a high logic, and the second logic state is a low logic.

12. The method of claim 11, wherein the outputs of the reset switch and the counter are high logic resets.

* * * * *